United States Patent
Hara et al.

(10) Patent No.: US 9,328,431 B2
(45) Date of Patent: *May 3, 2016

(54) APPARATUS FOR MANUFACTURING A SILICON CARBIDE SINGLE CRYSTAL COMPRISING A MOUNTING PORTION AND A PURGE GAS INTRODUCTION SYSTEM

(75) Inventors: Kazukuni Hara, Kasugai (JP); Yuuichirou Tokuda, Nisshin (JP)

(73) Assignee: DENSO CORPORATION, Kariya (JP)

( * ) Notice: Subject to any disclaimer, the term of this patent is extended or adjusted under 35 U.S.C. 154(b) by 1087 days.

This patent is subject to a terminal disclaimer.

(21) Appl. No.: 13/325,233

(22) Filed: Dec. 14, 2011

(65) Prior Publication Data
US 2012/0152165 A1  Jun. 21, 2012

(30) Foreign Application Priority Data
Dec. 16, 2010 (JP) ................. 2010-280309

(51) Int. Cl.
*C30B 25/14* (2006.01)
*C30B 25/16* (2006.01)
(Continued)

(52) U.S. Cl.
CPC .............. *C30B 25/165* (2013.01); *C30B 25/12* (2013.01); *C30B 25/14* (2013.01); *C30B 29/36* (2013.01)

(58) Field of Classification Search
CPC ........ C30B 25/00; C30B 25/02; C30B 25/10; C30B 25/12; C30B 25/14; C30B 25/16; Y10T 117/00; Y10T 117/10; Y10T 117/1016
USPC ............... 117/84, 88–89, 102, 104–107, 109, 117/200, 216–218, 224, 902, 906, 91, 117/93–94, 98–99, 204, 937, 951; 118/715, 118/724–726, 728; 423/345, 328.2; 427/249.15, 249.17

See application file for complete search history.

(56) References Cited

U.S. PATENT DOCUMENTS 7,045,009 B2 * 5/2006 Kato ................. C30B 29/36
117/105
7,361,222 B2 * 4/2008 Janzen .............. C30B 29/36
117/103

(Continued)

FOREIGN PATENT DOCUMENTS

JP  A-2002-362998  12/2002
JP  A-2007-176718  7/2007

OTHER PUBLICATIONS

Office Action dated Aug. 12, 2014 issued in corresponding CN patent application No. 201110431747.9 (and English translation).

(Continued)

*Primary Examiner* — Kenneth A Bratland, Jr.
(74) *Attorney, Agent, or Firm* — Posz Law Group, PLC

(57) ABSTRACT

An apparatus for manufacturing a silicon carbide single crystal grows the silicon carbide single crystal on a surface of a seed crystal made from a silicon carbide single crystal substrate by supplying a material gas for silicon carbide from below the seed crystal. The apparatus includes a base having a first side and a second side opposite to the first side. The seed crystal is mounted on the first side of the base. The apparatus further includes a purge gas introduction mechanism for supporting the base and for supplying a purge gas to the base from the second side of the base. The base has a purge gas introduction path for discharging the supplied purge gas from the base toward an outer edge of the seed crystal.

20 Claims, 5 Drawing Sheets

(51) Int. Cl.
*C30B 29/36* (2006.01)
*C30B 25/12* (2006.01)

(56) References Cited

U.S. PATENT DOCUMENTS

| | | | |
|---|---|---|---|
| 8,052,793 B2* | 11/2011 | Sakamoto | 117/74 |
| 8,685,163 B2* | 4/2014 | Terashima et al. | 117/54 |
| 8,882,911 B2* | 11/2014 | Tokuda et al. | 117/202 |
| 2005/0000406 A1 | 1/2005 | Janzen et al. | |
| 2006/0283389 A1 | 12/2006 | Valente et al. | |
| 2008/0026591 A1* | 1/2008 | Kordina | C23C 16/45519 438/758 |
| 2008/0149020 A1 | 6/2008 | Janzen et al. | |
| 2008/0182092 A1* | 7/2008 | Bondokov | C30B 23/00 428/220 |
| 2012/0152166 A1 | 6/2012 | Tokuda et al. | |

OTHER PUBLICATIONS

Office Action dated Dec. 30, 2013 issued in corresponding KR patent application No. 10-2011-0134710 (and English translation).
Office Action mailed Jan. 29, 2013 in corresponding JP Application No. 2010-280309 (and English translation).
Office Action mailed Oct. 23, 2012 in corresponding JP patent application No. 2010-280309 (and English translation).
KR Office Action dated Jun. 21, 2013 in the corresponding KR application No. 10-2011-0134710; English translation.
Office Action dated Feb. 28, 2014 issued in corresponding CN patent application No. 201110431747.9 (and English translation).
An Extended European Search Report dated Oct. 25, 2013 in the corresponding EP application No. 11192942.8.
Office Action dated Jan. 12, 2015 in corresponding CN patent application No. 201110431747.9 (and English translation).

* cited by examiner

APPARATUS FOR MANUFACTURING A SILICON CARBIDE SINGLE CRYSTAL COMPRISING A MOUNTING PORTION AND A PURGE GAS INTRODUCTION SYSTEM

CROSS REFERENCE TO RELATED APPLICATION

This application is based on and claims priority to Japanese Patent Application No. 2010-280309 filed on Dec. 16, 2010, the contents of which are incorporated by reference.

FIELD

The present invention relates to an apparatus and a method for manufacturing a silicon carbide (SiC) single crystal.

BACKGROUND

A SiC single crystal manufacturing apparatus has been proposed, for example, in JP-A-2007-176718. In the conventional apparatus, the diameter of the seed crystal is reduced by sublimation etching of the side surface and the outer edge of the seed crystal, where a lot of defects and distortions are likely to exist. Then, the diameter of the seed crystal is increased to a predetermined level by growing a SiC single crystal on the seed crystal. Specifically, the conventional apparatus includes a guide having an inner wall located facing the outer edge of the seed crystal. The inner diameter of the guide is smaller than the diameter of the seed crystal and increases with the distance from the seed crystal so that the diameter of the seed crystal can be increased.

Thus, the conventional apparatus may reduce or prevent defects and distortions on the outer edge of the seed crystal. Accordingly, the SiC single crystal manufactured by the conventional apparatus may have high quality.

However, when the outer edge of the seed crystal is removed by a sublimation etching method, the temperature difference between the SiC single crystal and the guide decreases with the growth of the SiC single crystal. Further, the clearance between the SiC single crystal and the guide increases with the growth of the SiC single crystal. Accordingly, the SiC material gas becomes difficult to flow so that a polycrystal can be grown between the SiC single crystal and the guide. As a result, the polycrystal is adhered to the SiC single crystal so that the quality of the outer edge of the SiC single crystal can be degraded.

Using a SiC single crystal manufacturing apparatus shown in FIGS. 6A and 6B may prevent the polycrystal from being adhered to the SiC single crystal. In the SiC single crystal manufacturing apparatus, the seed crystal where the SiC single crystal is grown is misaligned with a portion where the polycrystal is grown.

Specifically, in FIG. 6A, a seed crystal J2 is placed on a projection J1a of a base J1. Thus, a SiC single crystal J3 that is grown on the seed crystal J2 can be misaligned with a polycrystal J4 that is grown around the projection J1a. However, as the single crystal J3 is grown long on the seed crystal J2, the polycrystal J4 is grown around the projection J1a. Therefore, the polycrystal J4 may be adhered to the single crystal J3. In FIG. 6B, the projection J1a is surrounded by a canopy member J1b to prevent the polycrystal J4 from being grown around the projection J1a. However, as the single crystal J3 is grown long on the seed crystal J2, the polycrystal J4 may be adhered to and grown on the canopy member J1b. The polycrystal J4 on the canopy member J1b may be adhered to the single crystal J3.

SUMMARY

In view of the above, it is an object of the present invention to provide an apparatus and a method for manufacturing a high quality SiC single crystal by reducing or preventing adhesion of a polycrystal to the SiC single crystal.

According to an aspect of the present invention, an apparatus for manufacturing a silicon carbide single crystal grows the silicon carbide single crystal on a surface of a seed crystal made from a silicon carbide single crystal substrate by supplying a material gas for silicon carbide from below the seed crystal. The apparatus includes a base having a first side and a second side opposite to the first side. The seed crystal is mounted on the first side of the base. The apparatus further includes a purge gas introduction mechanism for supporting the base and for supplying a purge gas to the base from the second side of the base. The base has a purge gas introduction path for discharging the supplied purge gas from the base toward an outer edge of the seed crystal.

According to another aspect of the present invention, a method for manufacturing a silicon carbide single crystal grows the silicon carbide single crystal on a surface of a seed crystal made from a silicon carbide single crystal substrate. The method includes mounting the seed crystal on a first side of a base, supplying a material gas for silicon carbide from below the seed crystal mounted on the first side of the base, supplying a purge gas to the base from a second side of the base opposite to the first side, and discharging the supplied purge gas from the base toward an outer edge of the seed crystal.

BRIEF DESCRIPTION OF THE DRAWINGS

The above and other objects, features, and advantages will become more apparent from the following description and drawings in which like reference numerals depict like elements. In the drawings.

DETAILED DESCRIPTION OF THE PREFERRED EMBODIMENTS

First Embodiment

Figure 1:
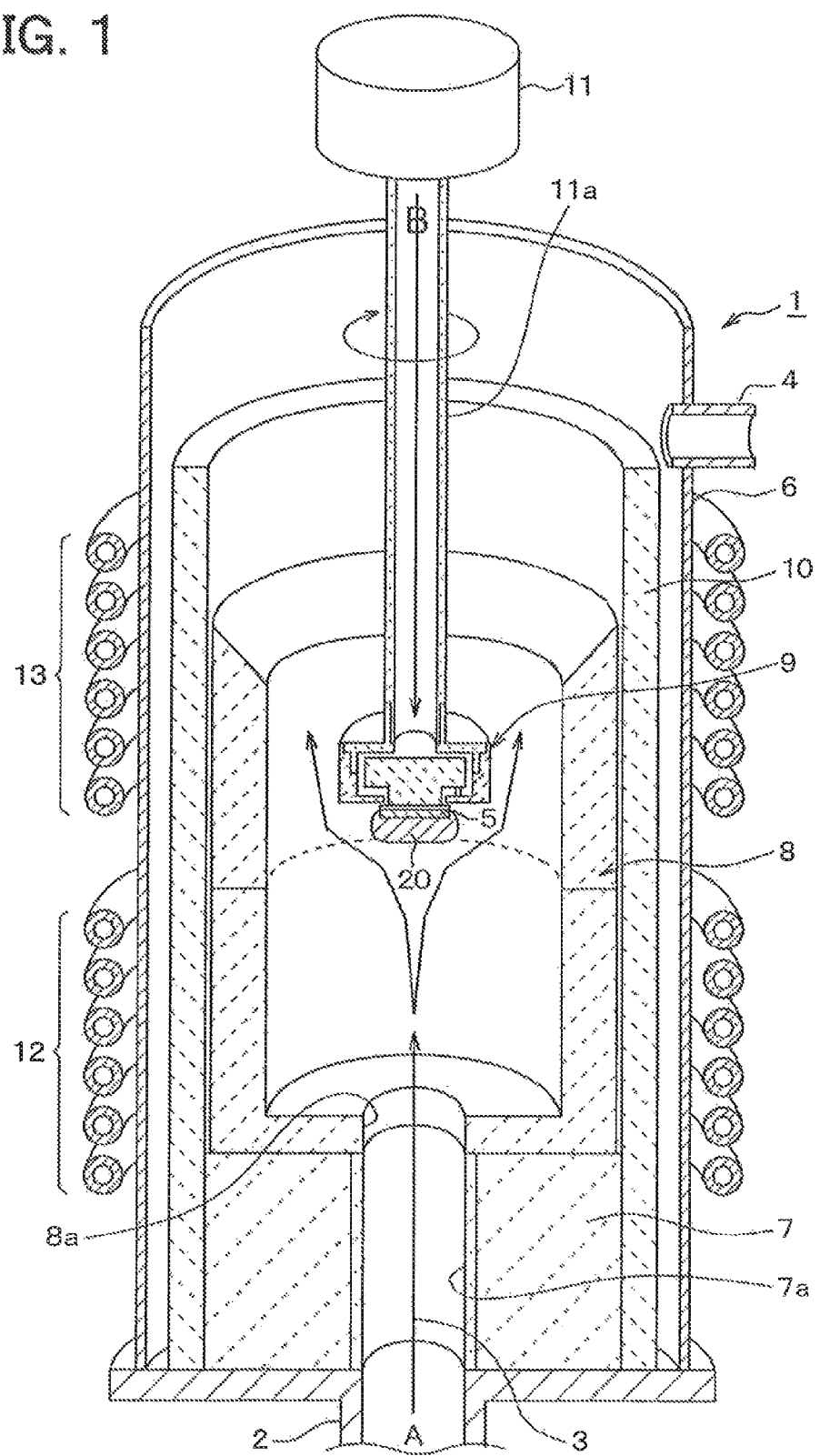
FIG. 1 is a diagram illustrating a perspective cross-sectional view of a SiC single crystal manufacturing apparatus according to a first embodiment of the present invention.

A SiC single crystal manufacturing apparatus 1 according to a first embodiment of the present invention is described below with reference to FIG. 1.

The manufacturing apparatus 1 has an material gas inlet port 2 and an material gas outlet port 4. The material gas inlet port 2 is located at a bottom of the manufacturing apparatus 1, and the material gas outlet port 4 is located at an upper part of the manufacturing apparatus 1. A seed crystal 5, which is made from a SiC single crystal substrate, is placed in the manufacturing apparatus 1. A carrier gas and a material gas 3 for SiC are introduced into the manufacturing apparatus 1 through the material gas inlet port 2 and discharged from the manufacturing apparatus 1 through the material gas outlet port 4 so that a SiC single crystal 20 can be grown on the seed crystal 5. The material gas 3 contains both Si and C. For example, the material gas 3 can be a gas mixture of a silane-based gas (e.g., silane) and a hydrocarbon-based gas (e.g., propane).

Specifically, the manufacturing apparatus 1 includes a vacuum container 6, a first heat insulator 7, a heating container 8, a base 9, a second heat insulator 10, a purge gas introduction mechanism 11, a first heating device 12, and a second heating device 13.

For example, the vacuum container 6 can be made of quartz glass. The vacuum container 6 has a cylindrical tube shape. The material gas inlet port 2 is located at a bottom of the vacuum container 6, and the material gas outlet port 4 is located at an upper part (e.g., upper part of a side wall) of the vacuum container 6. The carrier gas and the material gas 3 are introduced into an inner space of the vacuum container 6 through the material gas inlet port 2 and discharged from the inner space of the vacuum container 6 through the material gas outlet port 4. The vacuum container 6 is configured such that pressure in the inner space can be reduced by evacuating the inner space. Some components of the manufacturing apparatus 1 are accommodated in the inner space of the vacuum container 6.

The first heat insulator 7 has a cylindrical tube shape and defines a material gas introduction pipe 7a communicating with the material gas inlet port 2. The first heat insulator 7 is coaxially arranged with the vacuum container 6. For example, the first heat insulator 7 can be made of graphite. In this case, a surface of the first heat insulator 7 can be coated with a refractory (i.e., high-melting point) metal carbide such as tantalum carbide (TaC).

The heating container 8 has a reaction chamber in which the SiC single crystal 20 is grown on a surface of the seed crystal 5. For example, the heating container 8 can be made of graphite. In this case, a surface of the heating container 8 can be coated with a refractory metal carbide such as tantalum carbide (TaC). The heating container 8 is located on the upstream side of the base 9 in a flow direction of the material gas 3. Thus, the heating container 8 removes particles contained in the material gas 3 introduced from the material gas inlet port 2 and decomposes the material gas 3, before the material gas 3 reaches the seed crystal 5.

Specifically, the heating container 8 has a cylindrical tube shape. According to the first embodiment, the heating container 8 has a bottom with a gas introduction port 8a. The gas introduction port 8a communicates with the gas introduction pipe 7a of the first heat insulator 7 so that the material gas 3 flowing through the gas introduction pipe 7a can be introduced into the heating container 8 through the gas introduction port 8a.

The base 9 is coaxially arranged with the heating container 8. For example, the base 9 can be made of graphite. In this case, a surface of the base 9 can be coated with a refractory metal carbide such as tantalum carbide (TaC). The seed crystal 5 is mounted on the base 9, and the SiC single crystal 20 is grown on the surface of the seed crystal 5. The base 9 is described in detail below with reference to FIG. 2.

Figure 2:
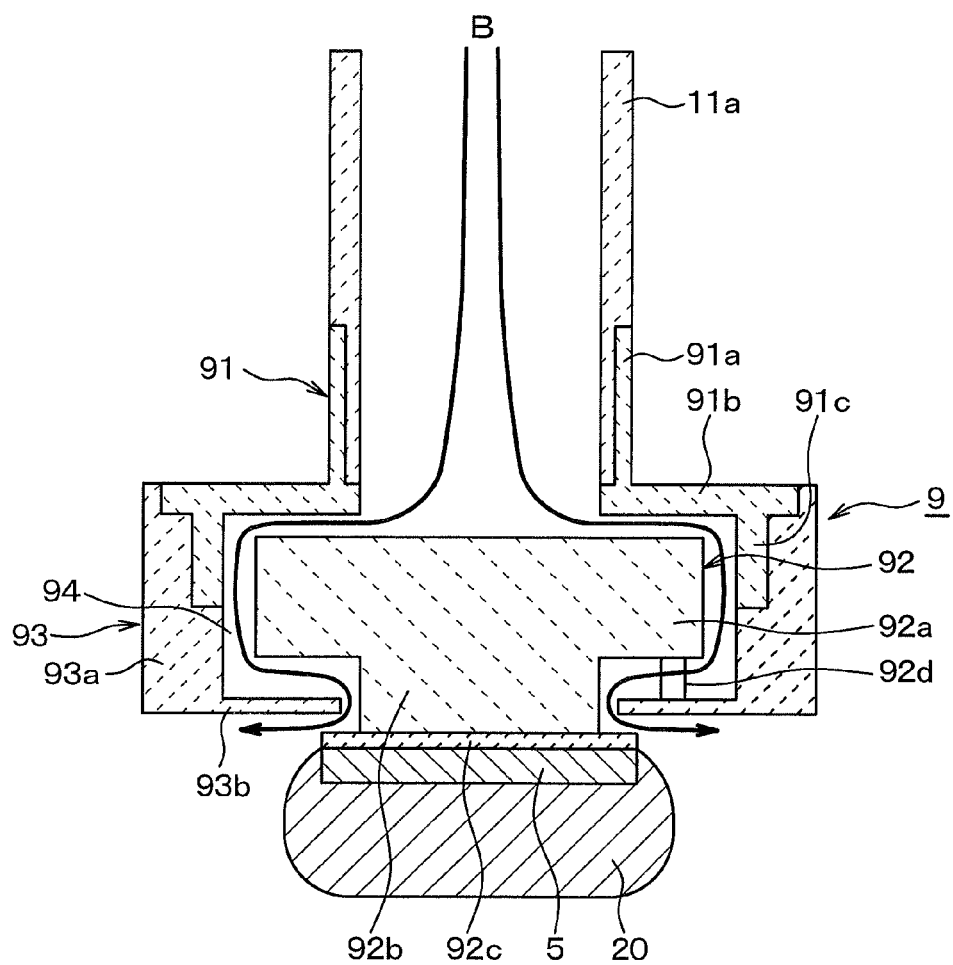
FIG. 2 is a diagram illustrating a partial enlarged view of FIG. 1, showing a base of the SiC single crystal manufacturing apparatus.

As shown in FIG. 2, the base 9 includes a coupling portion 91 coupled to the purge gas introduction mechanism 11 (not shown) via pipe member 11a, a mounting portion 92 where the seed crystal 5 is mounted, and a holding portion 93 for holding the mounting portion 92.

The coupling portion 91 has a first cylindrical tube 91a, a flange 91b, and a second cylindrical tube 91c. The first cylindrical tube 91a is coupled to a tip of a pipe member 11a of the purge gas introduction mechanism 11. The flange 91b extends in a radial outward direction of the first cylindrical tube 91a from an end of the first cylindrical tube 91a, opposite to an end coupled to the pipe member 11a. The second cylindrical tube 91c is formed on an outer region of a surface of the flange 91b, opposite to a surface where the first cylindrical tube 91a is formed. The first cylindrical tube 91a is coaxially arranged with the second cylindrical tube 91c. An inner diameter of the second cylindrical tube 91c is larger than an inner diameter of the first cylindrical tube 91a.

The mounting portion 92 has a solid cylindrical shape with different diameters along its center axis. Specifically, the mounting portion 92 includes a large diameter portion 92a and a small diameter portion 92b. A diameter of the small diameter portion 92b is smaller than a diameter of the large diameter portion 92a. The small diameter portion 92b is coaxially arranged with the large diameter portion 92a. Each of the diameters of the large diameter portion 92a and the small diameter portion 92b is smaller than the inner diameter of the second cylindrical tube 91c and an inner diameter of the holding portion 93 so that a clearance can be formed between the mounting portion 92 and each of the second cylindrical tube 91c and the holding portion 93. The clearance serves as a purge gas introduction path 94. The small diameter portion 92b is located under the large diameter portion 92a. A tip of the small diameter portion 92b extends beyond a lower edge of the holding portion 93.

A mounting plate 92c is attached to the tip of the small diameter portion 92b and located outside the holding portion 93. A diameter of the mounting plate 92c is larger than the diameter of the small diameter portion 92b. The seed crystal 5 is mounted on the mounting plate 92c. Multiple supporting members 92d are arranged on a lower surface of the large diameter portion 92a at a regular interval around the small diameter portion 92b. The supporting members 92d are located between the large diameter portion 92a and the holding portion 93 to support the mounting portion 92 on the holding portion 93. Each of the supporting members 92d has a predetermined length. Thus, the mounting portion 92 is spaced from the holding portion 93 by the supporting members 92d so that the purge gas introduction path 94 can be formed.

The holding portion 93 has a cylindrical tube portion 93a. The second cylindrical tube 91c of the coupling portion 91 is fitted into a first end of the cylindrical tube portion 93a. An adhesive is applied between the first end of the cylindrical tube portion 93a and the second cylindrical tube 91c so that the coupling portion 91 and the holding portion 93 can be fixed together. A second end of the cylindrical tube portion 93a is provided with a narrowed portion 93b that extends in a radial inward direction of the cylindrical tube portion 93a. An inner diameter of the narrowed portion 93b is smaller than an inner diameter of the cylindrical tube portion 93a. The supporting members 92d stand on the narrowed portion 93b to support the mounting portion 92 on the holding portion 93 in such a manner that the large diameter portion 92a is spaced from the narrowed portion 93b.

Referring back to FIG. 1, the second heat insulator 10 surrounds the heating container 8 and the base 9 to lead the remainder of the material gas 3 introduced to the base 9 toward the material gas outlet port 4. Specifically, the second heat insulator 10 is configured so that the remainder of the material gas 3 supplied to the seed crystal 5 can flow toward the material gas outlet port 4 through a clearance between the base 9 and the second heat insulator 10.

The purge gas introduction mechanism 11 is configured to rotate and lift the pipe member 11a. Specifically, a first end of the pipe member 11a is connected to a surface of the base 9, opposite to the surface where the seed crystal 5 is mounted. A second end of the pipe member 11a is connected to the purge gas introduction mechanism 11. Thus, the purge gas introduction mechanism 11 can rotate and lift the pipe member 11a along with the base 9, the seed crystal 5, and the SiC single crystal 20. The purge gas introduction mechanism 11 keeps a growth face of the SiC single crystal 20 at a temperature suitable for growth of the SiC single crystal 20 by rotating and lifting the pipe member 11a according to the growth of the SiC single crystal 20.

Further, the purge gas introduction mechanism 11 introduces a purge gas into the pipe member 11 a to supply the purge gas to the base 9, which is connected to the pipe member 11 a. For example, the purge gas can be an inert gas (e.g., Ar, He), an etching gas (e.g., $H_2$, HCl), or a mixture gas of the inert gas and the etching gas. The purge gas that is supplied from the purge gas introduction mechanism 11 to the base 9 is discharged from an outer edge of the seed crystal 5 in a radial outward direction with respect to the center axis of the base 9.

Each of the first heating device 12 and the second heating device 13 surrounds the vacuum container 6. For example, each of the first heating device 12 and the second heating device 13 can include a heat-generating induction coil, a heater, or the like. The first heating device 12 is located at a position corresponding to a lower part of the heating container 8, and the second heating device 13 is located at a position corresponding to the base 9. The first heating device 12 and the second heating device 13 are independently controlled so that the growth face of the SiC single crystal 20 can be adjusted to the temperature suitable for the growth of the SiC single crystal 20.

Next, a method for manufacturing the SiC single crystal 20 using the manufacturing apparatus 1 according to the first embodiment is described below.

Firstly, the seed crystal 5 is mounted on the base 9. Then, the first heating device 12 and the second heating device 13 are controlled to generate a predetermined temperature distribution in the heating container 8. The predetermined temperature distribution is set so that the material gas 3 can be recrystallized at the surface of the seed crystal 5 to grow the SiC single crystal 20 on the surface of the seed crystal 5. Further, the predetermined temperature distribution is set so that the recrystallization rate can be less than a sublimation rate in the heating container 8.

Then, the vacuum container 6 is kept at a predetermined pressure, and the material gas 3 is introduced into the vacuum container 6 through the gas introduction pipe 7 a. If necessary, a carrier gas (e.g., inert gas such as Ar, He) or an etching gas (e.g., $H_2$, HCl) can be introduced along with the material gas 3. Thus, as indicated by an arrow A in FIG. 1, the material gas 3 is supplied to the seed crystal 5 so that the SiC single crystal 20 can be grown on the seed crystal 5.

At this time, the purge gas introduction mechanism 11 introduces the purge gas into the pipe member 11a. Thus, as indicated by an arrow B in FIG. 2, the purge gas is supplied to the seed crystal 5 from the back side of the seed crystal 5 through the purge gas introduction path 94 and then discharged from the outer edge of the seed crystal 5 in the radial outward direction with respect to the center axis of the base 9.

Such a flow of the purge gas reduces or prevents formation of a polycrystal on a portion of the base 9 around the seed crystal 5, for example, the lower surface of the holding portion 93 and the lower surface of the large diameter portion 92a. Thus, even when the SiC single crystal 20 is grown long, it is possible to reduce or prevent adhesion of the polycrystal to the outer edge of the SiC single crystal 20. Therefore, the SiC single crystal 20 can be grown long without loss of quality of the outer edge of the SiC single crystal 20.

It is noted that the lower surface of the holding portion 93 is parallel to the horizontal plane. The small diameter portion 92b of the mounting portion 92 extends downward beyond the narrowed portion 93b, and the mounting plate 92c having the larger diameter than the small diameter portion 92b is attached to the tip of the small diameter portion 92b. Thus, an outlet (i.e., exit) of the purge gas introduction path 94 faces in the radial outward direction with respect to the center axis of the base 9 so that the purge gas can be discharged from the base 9 in the radial outward direction. Accordingly, the discharged purge gas flows along the lower surface of the holding portion 93 so that the formation of the polycrystal on the lower surface of the holding portion 93 can be reduced or prevented.

As described above, according to the first embodiment, the purge gas is supplied to the seed crystal 5 from the back side of the seed crystal 5 and discharged from the outer edge of the seed crystal 5 in the radial outward direction with respect to the center axis of the base 9. In such an approach, the flow of the purge gas reduces or prevents formation of the polycrystal on the portion of the base 9 around the seed crystal 5, for example, the lower surface of the holding portion 93 and the lower surface of the large diameter portion 92a. Thus, even when the SiC single crystal 20 is grown long, it is possible to reduce or prevent adhesion of the polycrystal to the outer edge of the SiC single crystal 20. Therefore, the SiC single crystal 20 can be grown long without loss of quality of the outer edge of the SiC single crystal 20.

Second Embodiment

A second embodiment of the present invention is described below with reference to FIG. 3. The second embodiment differs from the first embodiment in the shape of the base 9.

Figure 3:
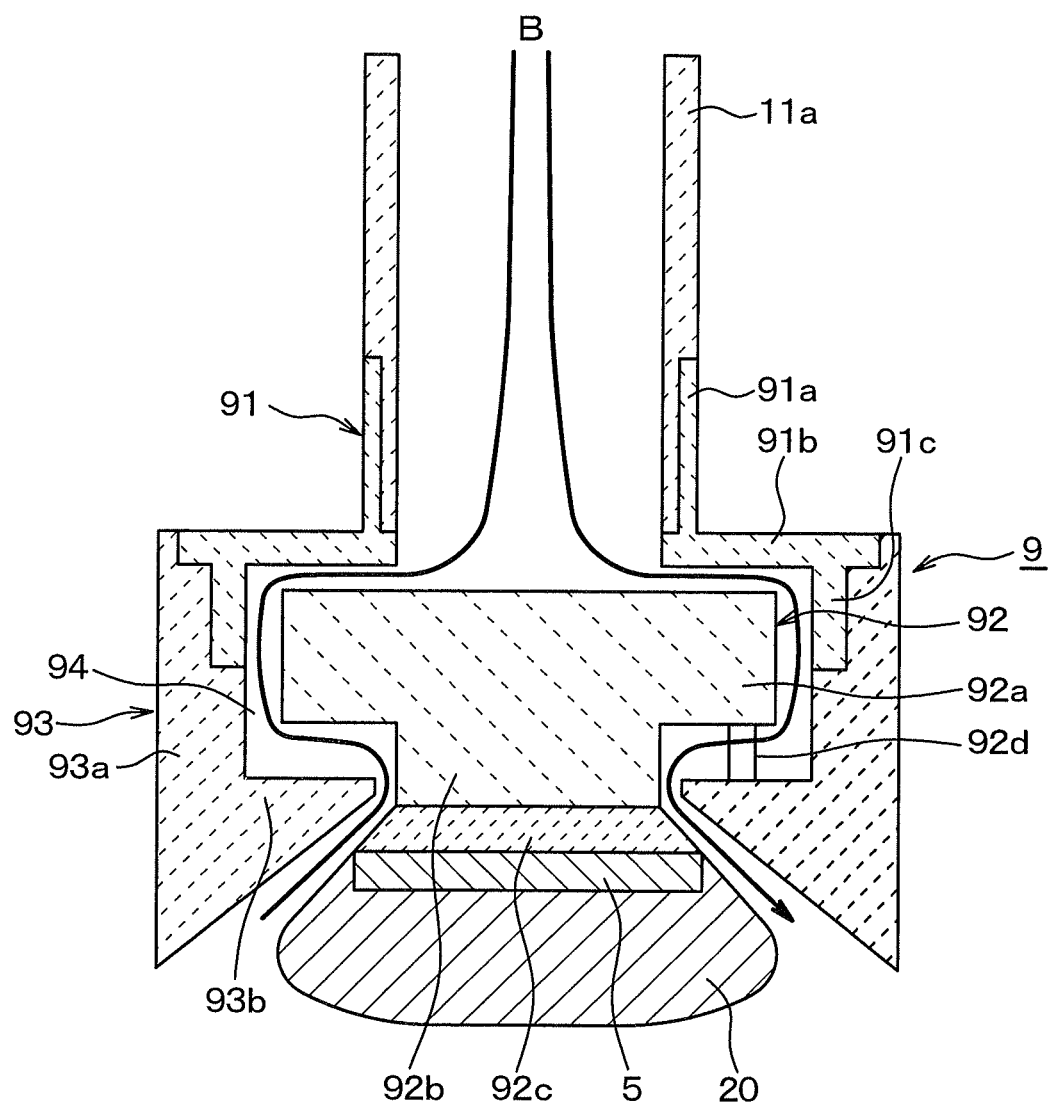
FIG. 3 is a diagram illustrating a partial enlarged cross-sectional view of a base of a SiC single crystal manufacturing apparatus according to a second embodiment of the present invention.

FIG. 3 is a diagram illustrating a partial enlarged cross-sectional view of a base 9 of a SiC single crystal manufacturing apparatus 1 according to the second embodiment. As shown in FIG. 3, according to the second embodiment, the lower surface of the holding portion 93 of the base 9 is tapered so that the diameter of the narrowed portion 93b with respect to the center axis of the base 9 can be increased in the direction of growth of the SiC single crystal 20.

As described above, according to the second embodiment, the lower surface of the holding portion 93 is tapered. In such an approach, the SiC single crystal 20 is grown along the tapered lower surface of the holding portion 93 so that the diameter of the SiC single crystal 20 can be increased. Further, since the purge gas flows along the tapered lower surface of the holding portion 93, the formation of the polycrystal on the tapered lower surface of the holding portion 93 can be prevented or reduced.

Third Embodiment

A third embodiment of the present invention is described below with reference to FIG. 4. The third embodiment differs from the first embodiment in the shape of the base 9.

Figure 4:
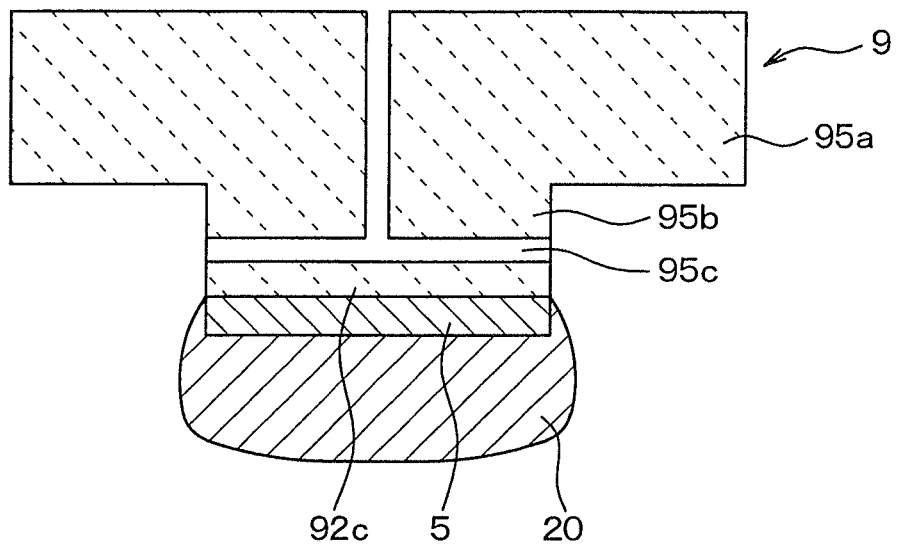
FIG. 4 is a diagram illustrating a partial enlarged cross-sectional view of a base of a SiC single crystal manufacturing apparatus according to a third embodiment of the present invention.

FIG. 4 is a diagram illustrating a partial enlarged cross-sectional view of a base 9 of a SiC single crystal manufacturing apparatus 1 according to the third embodiment. As shown in FIG. 4, according to the third embodiment, the base 9 has a cylindrical shape with different diameters along its center axis. Specifically, the base 9 includes a large diameter portion 95a and a small diameter portion 95b. A diameter of the small diameter portion 95b is smaller than a diameter of the large diameter portion 95a. The small diameter portion 95b is coaxially arranged with the large diameter portion 95a and located under the large diameter portion 95a. The seed crystal 5 is mounted on a tip of the small diameter portion 95b. That is, the tip of the small diameter portion 95b serves as the mounting plate 92c.

Further, the base 9 has a purge gas introduction path 95c. The purge gas introduction path 95c extends from the back side of the large diameter portion 95a to the small diameter portion 95b and then extends through the small diameter portion 95b in the radial outward direction with respect to the center axis of the base 9. Through the purge gas introduction path 95c, the purge gas is supplied to the seed crystal 5 from the back side of the seed crystal 5 and then discharged from the outer edge of the seed crystal 5 in the radial outward direction.

As described above, according to the third embodiment, the base 9 has the purge gas introduction path 95c that extends from the back side of the large diameter portion 95a to the small diameter portion 95b and then extends through the small diameter portion 95b in the radial outward direction. In such an approach, the flow of the purge gas reduces or prevents formation of the polycrystal on the portion of the base 9 around the seed crystal 5, for example, the lower surface of the large diameter portion 95a. Thus, even when the SiC single crystal 20 is grown long, it is possible to reduce or prevent adhesion of the polycrystal to the outer edge of the SiC single crystal 20. Therefore, the SiC single crystal 20 can be grown long without loss of quality of the outer edge of the SiC single crystal 20.

Fourth Embodiment

A fourth embodiment of the present invention is described below with reference to FIG. 5. The fourth embodiment is similar to the third embodiment. A difference between the third embodiment and the fourth embodiment is as follows.

Figure 5:
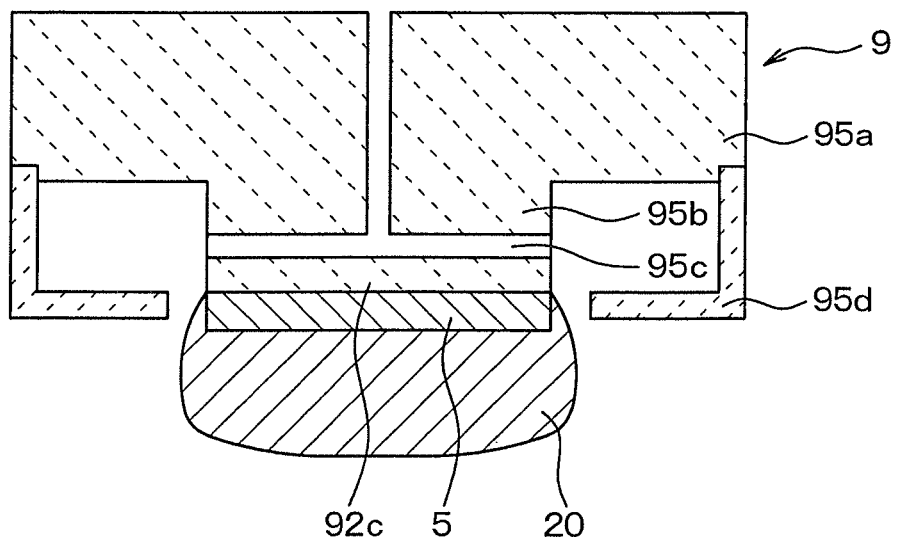
FIG. 5 is a diagram illustrating a partial enlarged cross-sectional view of a base of a SiC single crystal manufacturing apparatus according to a fourth embodiment of the present invention.
Figure 6A:
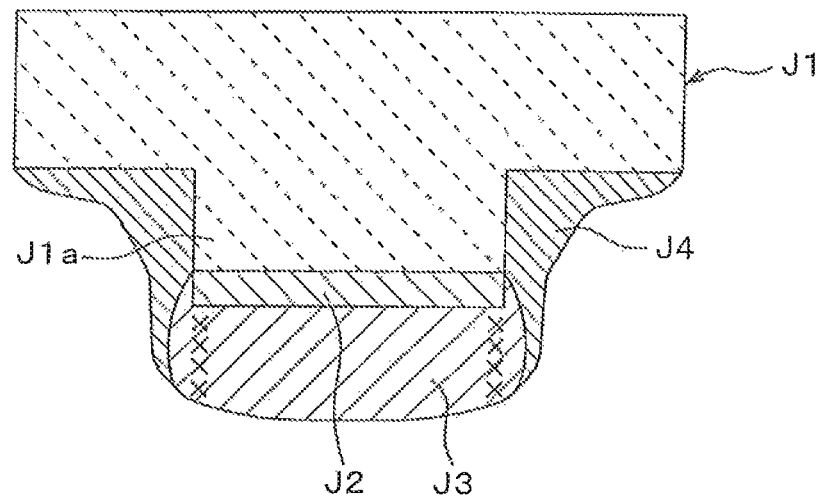
FIGS. 6A and 6B are diagrams illustrating a partial enlarged cross-sectional view of a base of a related-art SiC single crystal manufacturing apparatus.
Figure 6B:
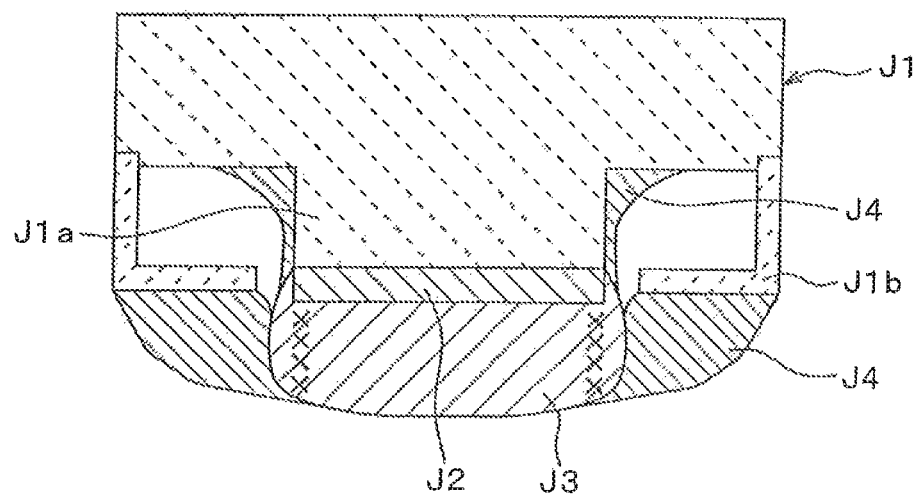

FIG. 5 is a diagram illustrating a partial enlarged cross-sectional view of a base 9 of a SiC single crystal manufacturing apparatus 1 according to the fourth embodiment. As shown in FIG. 5, according to the fourth embodiment, the base 9 further has a canopy portion 95d in addition to the large diameter portion 95a, the small diameter portion 95b, and the purge gas introduction path 95c. The canopy portion 95d covers the lower surface of the large diameter portion 95a and the side surface of the small diameter portion 95b. Specifically, the canopy portion 95d extends from the lower surface of the large diameter portion 95a and is bent toward the side surface of the small diameter portion 95b. A first end of the canopy portion 95d is joined to the large diameter portion 95a, and a second end of the canopy portion 95d is spaced from the small diameter portion 95b. The purge gas flowing through the purge gas introduction path 95c is discharged from the base 9 through a clearance between the canopy portion 95d and the small diameter portion 95b so that the discharged purge gas can flow to the outer edge of the seed crystal 5.

As described above, according to the fourth embodiment, the base 9 further has the canopy portion 95d that covers the lower surface of the large diameter portion 95a and the side surface of the small diameter portion 95b. In such an approach, the flow of the purge gas reduces or prevents formation of the polycrystal on the portion of the base 9 around the seed crystal 5, for example, the lower surface of the large diameter portion 95a and the lower surface of the canopy portion 95d. Thus, even when the SiC single crystal 20 is grown long, it is possible to reduce or prevent adhesion of the polycrystal to the outer edge of the SiC single crystal 20. Therefore, the SiC single crystal 20 can be grown long without loss of quality of the outer edge of the SiC single crystal 20.

MODIFICATIONS

The above embodiments can be modified in various ways, for example, as follows.

It is preferable that the surface of the base 9 be coated with a refractory metal carbide such as tantalum carbide (TaC). In such an approach, the surface of the base 9 is protected from thermal etching and the etching gas so that formation of the polycrystal on the surface of the base 9 can be reduced or prevented. In particular, it is preferable that the lower surface of the narrowed portion 93b of the holding portion 93 be coated with a refractory metal carbide.

The purge gas can be an inert gas, an etching gas, a dopant gas for silicon carbide, or a mixture gas of at least two of the inert gas, the etching gas, and the dopant gas. For example, the dopant gas can be a nitrogen ($N_2$) gas.

Such changes and modifications are to be understood as being within the scope of the present invention as defined by the appended claims.

What is claimed is:

1. An apparatus for manufacturing a silicon carbide single crystal by growing the silicon carbide single crystal on a surface of a seed crystal made from a silicon carbide single crystal substrate by supplying a material gas for silicon carbide from below the seed crystal, the apparatus comprising:
   a base including a mounting portion where the seed crystal is mounted, the mounting portion including a first side and a second side opposite to the first side, the seed crystal is mounted on the first side of the mounting portion; and
   a purge gas introduction mechanism attached to the base and supplying a purge gas to the base from the second side of the mounting portion, wherein
   the mounting portion includes a large diameter portion located on a top of a small diameter portion and includes a purge gas introduction path downwardly extending along a center the large diameter portion and thereafter extending in the radial outward direction with respect to the center axis of the small diameter portion.

2. The apparatus according to claim 1, wherein
   an outlet of the purge gas introduction path is directed in a radial outward direction with respect to a center axis of the base so that the purge gas is discharged in a direction from the outer edge of the seed crystal and flows along a lower surface of the base.

3. The apparatus according to claim 1, wherein
   the purge gas introduction mechanism is configured to supply the purge gas as an inert gas, an etching gas, a dopant gas for silicon carbide, or a mixture gas of at least two of the inert gas, the etching gas, and the dopant gas.

4. The apparatus according to claim 1, wherein
   a surface of the base is coated with a refractory metal carbide.

5. The apparatus according to claim 1, wherein the purge gas introduction mechanism is configured to rotate and lift the base, the seed crystal, and the silicon carbide single crystal via a pipe member that includes
- a first end connected to a surface of the base portion opposite to the surface where the seed crystal is mounted, and
- a second end connected to the purge gas introduction mechanism.

6. The apparatus according to claim 1, further comprising a mounting plate is attached to an end of the small diameter portion.

7. An apparatus for manufacturing a silicon carbide single crystal by growing the silicon carbide single crystal on a surface of a seed crystal made from a silicon carbide single crystal substrate by supplying a material gas for silicon carbide from below the seed crystal, the apparatus comprising:
- a base including a mounting portion where the seed crystal is mounted, the mounting portion including a first side and a second side opposite to the first side, seed crystal is mounted on the first side of the mounting portion;
- a canopy portion including a first end attached to a large diameter portion and a second end angled toward a small diameter portion; and
- a purge gas introduction mechanism attached to the base and supplying a purge gas to the base from the second side of the mounting portion, wherein
- the mounting portion includes a large diameter portion located on a top of a small diameter portion, and
- the second end of the canopy portion is spaced from the small diameter portion such that purge gas flowing through a purge gas introduction path can be discharged through a clearance between the canopy portion and the small diameter portion.

8. The apparatus according to claim 7, wherein
the purge gas introduction mechanism is configured to supply the purge gas as an inert gas, an etching gas, a dopant gas for silicon carbide, or a mixture gas of at least two of the inert gas, the etching gas, and the dopant gas.

9. The apparatus according to claim 7, wherein the purge gas introduction mechanism is configured to rotate and lift the base, the seed crystal, and the silicon carbide single crystal via a pipe member that includes
- a first end connected to a surface of the base portion opposite to the surface where the seed crystal is mounted, and
- a second end connected to the purge gas introduction mechanism.

10. The apparatus according to claim 7, wherein
a surface of the base is coated with a refractory metal carbide.

11. The apparatus according to claim 7, further comprising a mounting plate is attached to an end of the small diameter portion.

12. The apparatus according to claim 7, wherein
the canopy portion surrounds the small diameter portion.

13. The apparatus according to claim 7, wherein
the first end of the canopy portion is attached to a lower surface of the large diameter portion.

14. An apparatus for manufacturing a silicon carbide single crystal by growing the silicon carbide single crystal on a surface of a seed crystal made from a silicon carbide single crystal substrate by supplying a material gas for silicon carbide from below the seed crystal, the apparatus comprising:
- a base including a mounting portion where the seed crystal is mounted, the mounting portion including a first side and a second side opposite to the first side, the seed crystal is mounted on the first side of the mounting portion;
- a canopy portion including a first end attached to a large diameter portion and a second end angled toward a small diameter portion; and
- a purge gas introduction mechanism attached to the base and supplying a purge gas to the base from the second side of the mounting portion, wherein
- the mounting portion includes a large diameter portion located on a top of a small diameter portion, and
- the mounting portion further includes a purge gas introduction path downwardly extending along a center of the large diameter portion and thereafter extending in the radial outward direction with respect to the center axis of the small diameter portion.

15. The apparatus according to claim 14, wherein
the purge gas introduction mechanism is configured to supply the purge gas as an inert gas, an etching gas, a dopant gas for silicon carbide, or a mixture gas of at least two of the inert gas, the etching gas, and the dopant gas.

16. The apparatus according to claim 14, wherein the purge gas introduction mechanism is configured to rotate and lift the base, the seed crystal, and the silicon carbide single crystal via a pipe member that includes
- a first end connected to a surface of the base portion opposite to the surface where the seed crystal is mounted, and
- a second end connected to the purge gas introduction mechanism.

17. The apparatus according to claim 14, wherein
a surface of the base is coated with a refractory metal carbide.

18. The apparatus according to claim 14, further comprising
a mounting plate is attached to an end of the small diameter portion.

19. The apparatus according to claim 14, wherein
the canopy portion surrounds the small diameter portion.

20. The apparatus according to claim 14, wherein
the first end of the canopy portion is attached to a lower surface of the large diameter portion.

* * * * *